US012334876B2

(12) United States Patent
Huang et al.

(10) Patent No.: US 12,334,876 B2
(45) Date of Patent: Jun. 17, 2025

(54) AUDIO PLAYER DEVICE AND STARTUP METHOD THEREOF (71) Applicant: SigmaStar Technology Ltd., Fujian (CN)

(72) Inventors: Cheng-Qi Huang, Shanghai (CN); Zhun Chen, Shanghai (CN); Zhong-Yuan Wan, Shanghai (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 273 days.

(21) Appl. No.: 18/203,202

(22) Filed: May 30, 2023

(65) Prior Publication Data

US 2023/0421108 A1 Dec. 28, 2023

(30) Foreign Application Priority Data

Jun. 22, 2022 (CN) .......................... 202210716307.6

(51) Int. Cl.
*H03F 1/26* (2006.01)
*H03F 3/183* (2006.01)
*H03M 1/66* (2006.01)
*H04R 3/00* (2006.01)

(52) U.S. Cl.
CPC .............. *H03F 1/26* (2013.01); *H03F 3/183* (2013.01); *H03M 1/66* (2013.01); *H04R 3/00* (2013.01); *H03F 2200/03* (2013.01)

(58) Field of Classification Search
CPC ........ H03F 1/26; H03F 3/183; H03F 2200/03; H03F 1/0244; H03F 3/187; H03M 1/66; H03M 1/745; H04R 3/00; H03G 3/348; G10K 11/17821; G10K 11/1785
USPC ................................ 381/94.5, 120, 121, 123
See application file for complete search history.

(56) References Cited

U.S. PATENT DOCUMENTS

| | | | | |
|---|---|---|---|---|
| 5,939,938 A | * | 8/1999 | Kalb | H03F 1/305 |
| | | | | 381/94.5 |
| 7,038,514 B2 | * | 5/2006 | Leith | H02M 1/36 |
| | | | | 327/540 |
| 7,906,945 B2 | * | 3/2011 | Kao | G05F 1/10 |
| | | | | 323/901 |
| 9,854,357 B1 | * | 12/2017 | Das | H03F 1/34 |
| 9,882,481 B2 | * | 1/2018 | Mascioli | H02M 1/36 |
| 2003/0058040 A1 | * | 3/2003 | Miyagaki | H03F 3/217 |
| | | | | 330/10 |
| 2005/0194951 A1 | * | 9/2005 | Mehas | H02M 3/156 |
| | | | | 323/282 |

(Continued)

*Primary Examiner* — Xu Mei
(74) *Attorney, Agent, or Firm* — Edell, Shapiro & Finnan, LLC (57) ABSTRACT

An audio player device includes a digital-to-analog converter (DAC), a startup circuit, a multiplexer and an output amplifier. The DAC converts audio data into a first signal and a second signal. The startup circuit gradually increases a level of a startup voltage according to a reference voltage during a predetermined period. The multiplexer outputs the startup voltage as a control voltage during the predetermined period, and switches to output the reference voltage as the control voltage after the predetermined period has elapsed. The output amplifier generates an audio signal according to the control voltage, the first signal and the second signal. The control voltage is used to set a common mode voltage of the output amplifier.

10 Claims, 7 Drawing Sheets

(56) References Cited

U.S. PATENT DOCUMENTS

| | | | | |
|---|---|---|---|---|
| 2006/0066363 A1* | 3/2006 | Ho | ................... | H03F 1/0261 |
| | | | | 327/108 |
| 2011/0274290 A1* | 11/2011 | Holzmann | ............. | H03F 1/305 |
| | | | | 381/94.1 |
| 2016/0169947 A1* | 6/2016 | De Fazio | ............... | G01R 19/10 |
| | | | | 327/59 |
| 2019/0326867 A1* | 10/2019 | Danioni | ................... | H03F 3/70 |

* cited by examiner

AUDIO PLAYER DEVICE AND STARTUP METHOD THEREOF

This application claims the benefit of China application Serial No. CN202210716307.6, filed Jun. 22, 2022, the subject matter of which is incorporated herein by reference.

BACKGROUND OF THE INVENTION

Field of the Invention

The present application relates to an audio player device, and more particularly, to an audio player device capable of reducing a startup noise and a startup method thereof.

Description of the Related Art

An amplifier is often used in an audio player to amplify an audio signal in order to drive an external loudspeaker. In the prior art, an internal voltage of a system instantaneously rises at a startup of an audio player, such that the amplifier generates a noise due to the voltage jump and the loudspeaker outputs a sharp noise, hence degrading user experiences.

SUMMARY OF THE INVENTION

In some embodiments, it is an object of the present application to provide an audio player device having a slow startup mechanism and a startup method thereof so as to improve the issues of the prior art.

In some embodiments, an audio player device includes a digital-to-analog converter (DAC), a startup circuit, a multiplexer and an output amplifier. The DAC converts audio data into a first signal and a second signal. The startup circuit gradually increases a level of a startup voltage according to a reference voltage during a predetermined period. The multiplexer outputs the startup voltage as a control voltage during the predetermined period, and switches to output the reference voltage as the control voltage after the predetermined period has elapsed. The output amplifier generates an audio signal according to the control voltage, the first signal and the second signal. The control voltage is used to set a common mode voltage of the output amplifier.

In some embodiments, a startup method for starting an audio player device includes operations of: setting all of a plurality of bits of audio data to a first logical value, wherein the audio data is converted into an audio signal by an output amplifier in the audio player device; gradually adjusting a level of a startup voltage by a startup circuit in the audio player device according to a reference voltage during a predetermined period, and outputting the startup voltage as a control voltage used to set a common mode level of the output amplifier; switching to output the reference voltage as the control voltage after the predetermined period has elapsed; and gradually switching a half of the plurality of bits to a second logical value.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
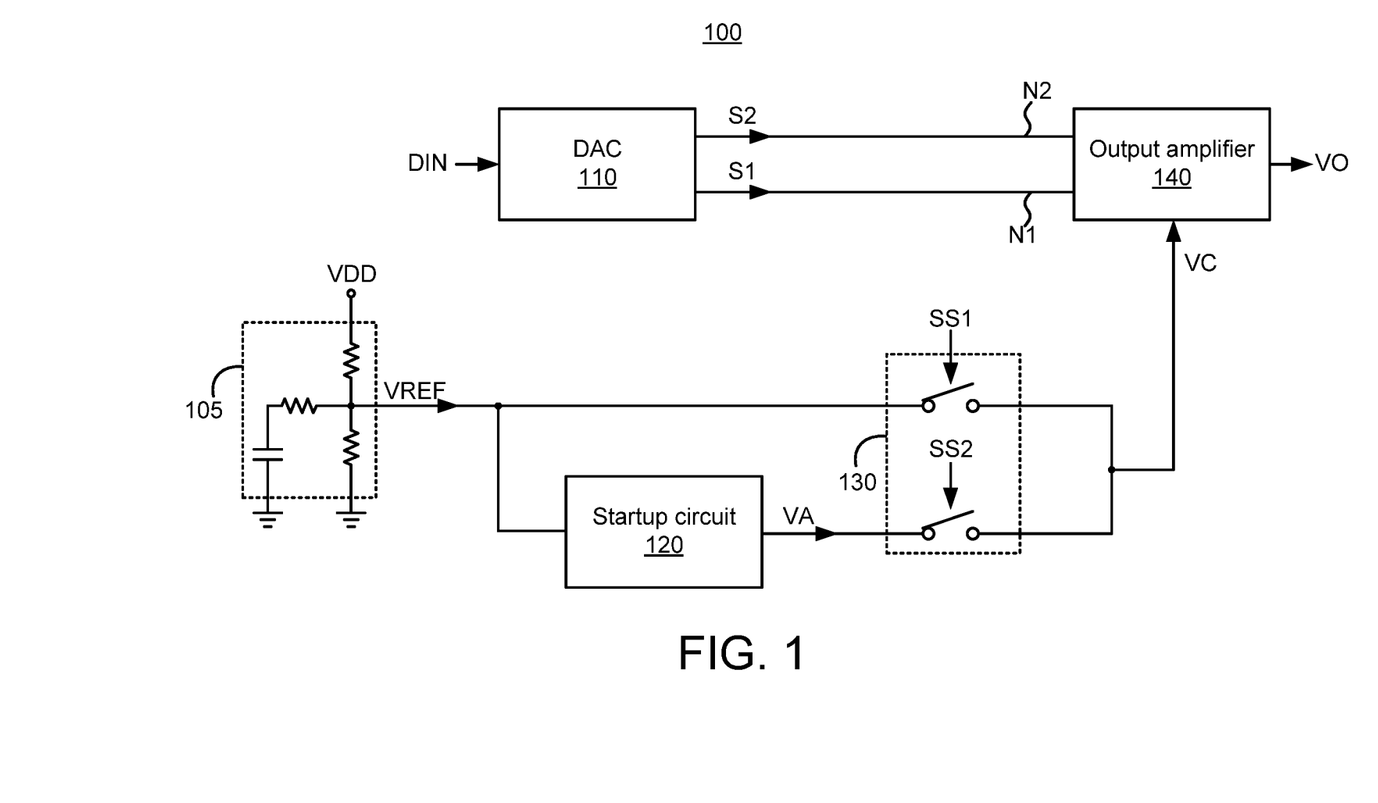
FIG. 1 is a schematic diagram of an audio player device according to some embodiments of the present application.

FIG. 1 shows a schematic diagram of an audio player device 100 according to some embodiments of the present application. The audio player device 100 includes a reference voltage generator 105, a digital-to-analog converter (DAC) 110, a startup circuit 120, a multiplexer 130 and an output amplifier 140. The reference voltage generator 105 generates a reference voltage VREF according to a power supply voltage VDD. For example, the reference voltage generator 105 includes a plurality of resistors, and may divide the power supply voltage VDD to generate the reference voltage VREF. The DAC 110 converts audio data DIN into a signal S1 and a signal S2, transmits the signal S1 to a positive input terminal (denoted as a node N1) of the output amplifier 140, and transmits the signal S2 to a negative input terminal (denoted as a node N2) of the output amplifier 140. In some embodiments, the DAC 110 may be a current DAC, which may convert the audio data DIN into a corresponding current signal (that is, the signal S1 and the signal S2).

The startup circuit 120 gradually increases a level of a startup voltage VA according to the reference voltage VREF. The multiplexer 130 outputs one of the startup voltage VA and the reference voltage VREF as a control voltage VC. For example, when the audio player device 100 has just been powered, the multiplexer 130 may output the startup voltage VA as the control voltage VA according to a switching signal SS1 and a switching signal SS2, and output the reference voltage VREF as the control voltage VC according to the switching signal SS1 and the switching signal SS2 after a predetermined period has elapsed, wherein states of the switching signal SS1 and the switching signal SS2 may be set by software or a controller in the system of the audio player device 100. In some embodiments, after the predetermined period has elapsed, the level of the startup voltage VA may approximate or be equal to the level of the reference voltage VREF.

The output amplifier 140 generates an audio signal VO according to the control voltage VA, the signal S1 and the signal S2, wherein the control signal VC is used to set a common mode level of the output amplifier 140. Related operation details are to be described with reference to FIG. 4 below. In some related art, an amplifier is directly driven by a driving voltage (for example, the reference voltage VREF) in a system. In such prior art, when an audio player device is powered, the level of the driving voltage instantaneously rises, such that the amplifier generates a noticeable noise that degrades user experience. Compared to the above related prior art, in one embodiment of the present application, during a startup of the audio player device 100, the output amplifier 140 first basically is driven by the startup voltage VA that gradually rises, and is switched to be driven by the reference voltage VREF once the level of the rising startup voltage VA approximates or is equal to the reference voltage VREF. Thus, the output amplifier 140 is prevented from generating a noticeable noise during the startup.

Figure 2A:
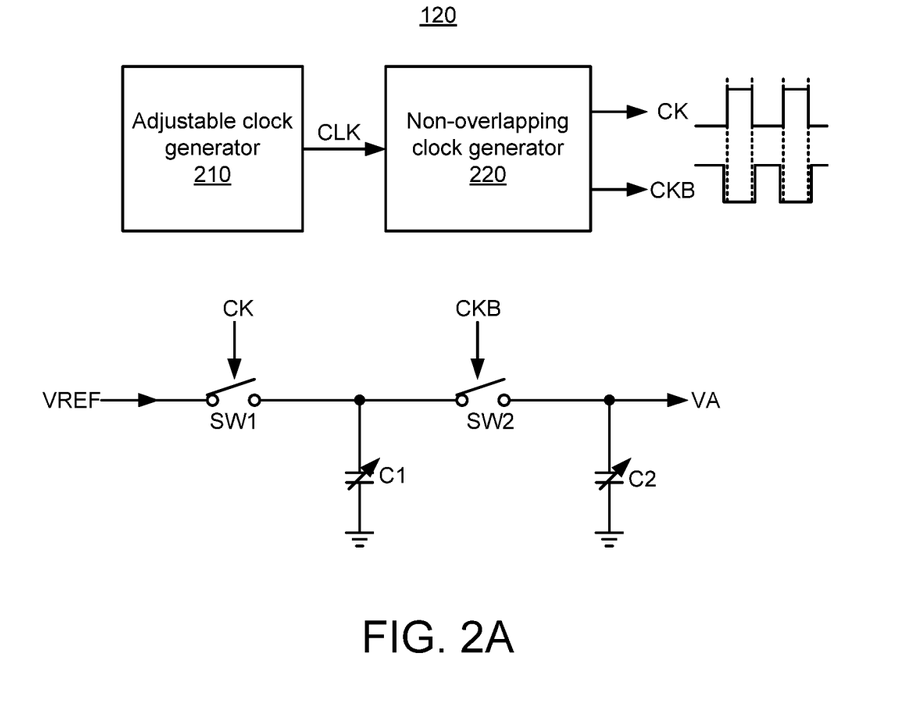
FIG. 2A is a schematic diagram of a startup circuit in FIG. 1 according to some embodiments of the present application.

FIG. 2A shows a schematic diagram of the startup circuit 120 in FIG. 1 according to some embodiments of the present application. In this example, the startup circuit 120 may perform a capacitor charge/discharge operation according to a clock signal CK, a clock signal CKB and the reference voltage VREF so as to generate the startup voltage VA. The clock signal CK and the clock signal CKB are non-overlapping clock signals, that is, the clock signal CK and the clock signal CKB do not simultaneously have a high level.

More specifically, the startup circuit 120 may include an adjustable clock generator 210, a non-overlapping clock generator 220, a switch SW1, a switch SW2, a capacitor C1 and a capacitor C2. The adjustable clock generator 210 generates a system clock signal CLK. The non-overlapping clock generator 220 may generate the clock signal CK and the clock signal CKB according to the system clock signal CLK. A first terminal of the switch SW1 receives the reference voltage VREF, a second terminal of the switch SW1 is coupled to a first terminal of the capacitor C1, and a control terminal of the switch SW1 receives the clock signal CK. A second terminal of the capacitor C1 is coupled to ground. The switch SW1 is selectively turned on according to the clock signal CK to transmit the reference voltage VREF to the capacitor C1, so as to charge the capacitor C1. A first terminal of the switch SW2 is coupled to the first terminal of the capacitor C1, a control terminal of the switch SW2 is coupled to the first terminal of the capacitor C2 and generates the startup voltage VA, and a control terminal of the switch SW2 receives the clock signal CKB. A second terminal of the capacitor C2 is coupled to ground. The switch SW2 is selectively turned on according to the clock signal CKB to transfer charge on the capacitor C1 to the capacitor C2, so as to generate the startup voltage VA.

As described above, the clock signal CK and the clock signal CKB do not simultaneously have a high level. In this example, the switch SW1 is turned on during a high level period of the clock signal CK, and the switch SW2 is turned on during a high level period of the clock signal CKB. In other words, the switch SW1 and the switch SW2 are not simultaneously turned on; that is, when one of the switch SW1 and the switch SW2 is turned on, the other of the switch SW1 and the switch SW2 is turned off. More specifically, during the high level period of the clock signal CK, the switch SW1 is turned on and transmits the reference voltage VREF to the capacitor C1. Thus, the capacitor C1 is charged by the reference voltage VREF. Next, during the high level period of the clock signal CKB, the switch SW1 is turned off and the switch SW2 is turned on. Thus, the charge stored in the capacitor C1 is transferred to the capacitor C2 to charge the capacitor C2. By repeating the above operations, the level of the startup voltage VA gradually rises such that the level of the startup voltage VA rises within a predetermined period to approximate or be equal to the reference voltage VREF. In some embodiments, the duration of the above predetermined period may be obtained by means of simulation or measuring, and be recorded as the predetermined period. Hence, in subsequent applications, software or a controller in the system may adjust states of the switching signal SS1 and the switching signal SS2 after the predetermined period has elapsed from the audio player device 100 has just been started, so as to switch an output of the multiplexer 130.

When the audio player device 100 is applied in a scenario that is a low-noise environment, a speed at which the startup circuit 120 increases the startup voltage VA may be reduced by lowering the frequencies of the clock signal CK and the clock signal CKB and/or increasing a capacitance ratio between the capacitor C2 and the capacitor C1. Thus, the audio player device 100 is prevented from generating a noticeable startup noise. Alternatively, when the audio player device 100 is applied in a scenario that is a noisy environment, a speed at which the startup circuit 120 increases the startup voltage VA may be accelerated by increasing the frequencies of the clock signal CK and the clock signal CKB and/or decreasing a capacitance ratio between the capacitor C2 and the capacitor C1. Thus, the startup speed of the audio player device 100 can be accelerated to allow the audio player device 100 to more quickly start outputting the audio signal VO.

Figure 2B:
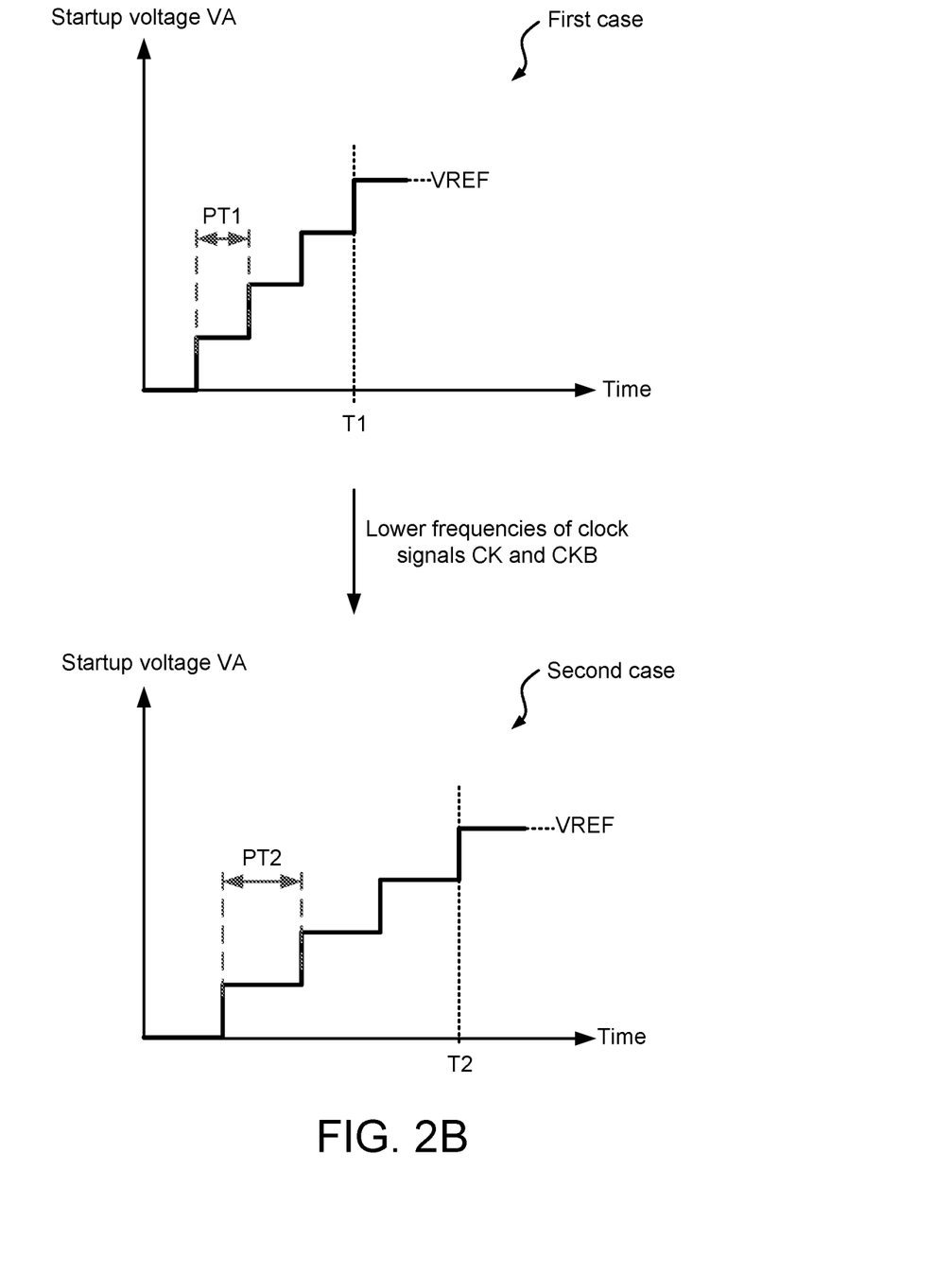
FIG. 2B is a schematic diagram of adjusting a rising speed of a startup voltage by adjusting frequencies of clock signals in FIG. 2A according to some embodiments of the present application.

FIG. 2B shows a schematic diagram of adjusting a rising speed of the startup voltage VA by adjusting the frequencies of clock signals CK and CKB in FIG. 2A according to some embodiments of the present application. In a first case, the frequencies of the clock signals CK and CKB are set to a predetermined frequency. Thus, the switch SW1 and the switch SW2 may respectively perform charging and transfer charge in a predetermined period PT1 (that is, the reciprocals of the frequencies of the clock signals CK and CKB). Under the above conditions, the startup voltage VA can rise to approximate or be equal to the reference voltage VREF at a timing T1. Alternatively, in a second case, the frequencies of the clock signals CK and CKB are lowered to another frequency lower than the predetermined frequency. Thus, the switch SW1 and the switch SW2 may respectively perform charging and transfer charge within a longer period PT2 (that is, the reciprocal of the another frequency). Under the above conditions, the startup voltage VA is postponed to approximate or be equal to the reference voltage VREF only at a timing T2. As shown in FIG. 2B, the timing T2 is later than the timing T1. In other words, the speed at which the startup circuit 120 increases the startup voltage VA gets slower as the frequencies of the clock signals CK and CKB are lower.

In some embodiments, software or a controller in the system may control the adjustable clock generator 210 by means of a user input and/or a control instruction from other circuits to adjust the frequency of the system clock signal CLK, so as to adjust the frequencies of the clock signals CK and CKB to further accordingly adjust the speed at which the startup circuit 120 increases the startup voltage VA. In some embodiments, the adjustable clock signal 210 may be implemented by, for example but not limited to, a phase-locked loop (PLL).

Figure 2C:
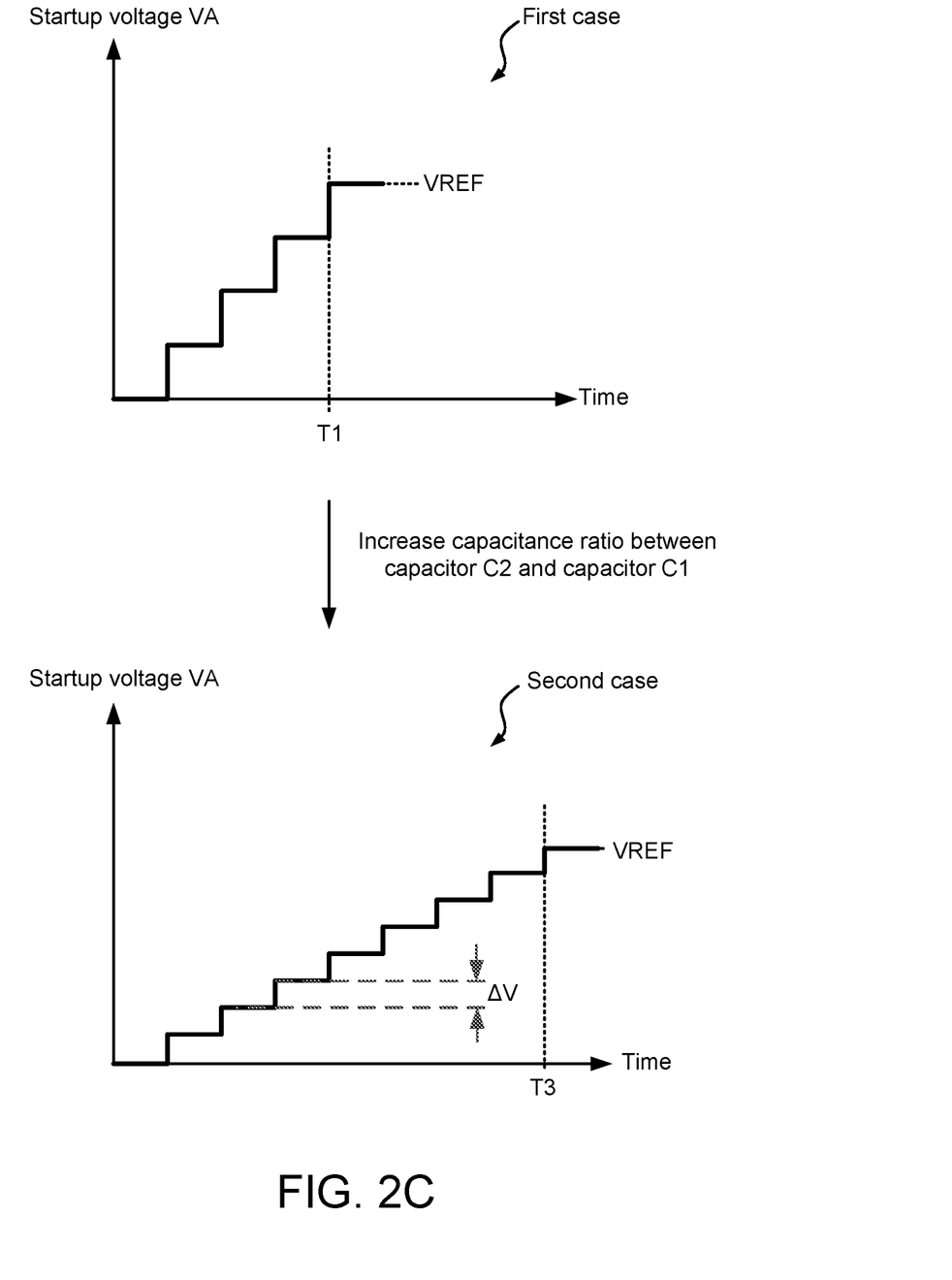
FIG. 2C is a schematic diagram of adjusting a rising speed of a startup voltage by adjusting a capacitance ratio between a plurality of capacitors in FIG. 2A according to some embodiments of the present application.

FIG. 2C shows a schematic diagram of adjusting a rising speed of the startup voltage VA by adjusting a capacitance ratio between the capacitors C1 and C2 in FIG. 2A according to some embodiments of the present application. In some embodiments, as shown in FIG. 2A, each of the capacitor C1 and the capacitor C2 may be a varactor. To achieve a slow startup, the capacitance value of the capacitor C1 is less than the capacitance value of the capacitor C2, so as to prevent an overly large change in the startup voltage VA in each period (for example, an on period of the switch SW2).

In a first case, the capacitance ratio between the capacitor C2 and the capacitor C1 is a predetermined value. Thus, the startup voltage VA can rise to approximate or be equal to the reference voltage VREF at the timing T1. Alternatively, in a second case, the capacitance value of the capacitor C2 is adjusted to be larger and/or the capacitance of the capacitor C1 is adjusted to be smaller, such that the capacitance ratio between the capacitor C2 and the capacitor C1 is adjusted to another value higher than the predetermined value. Thus, a change ΔV in the startup voltage VA becomes less in each period. Under the above conditions, the startup voltage VA is postponed to approximate or be equal to the reference voltage VREF only at a timing T3. As shown in FIG. 2C, the timing T3 is later than the timing T1. In other words, the speed at which the startup circuit 120 increases the startup voltage VA gets slower as the capacitance ratio between the capacitor C2 and the capacitor C1 gets higher.

In some embodiments, software or a controller in the system may control the capacitance values of the capacitor C1 and/or the capacitor C2 by means of a user input and/or a control instruction from other circuits, to further accordingly adjust the speed at which the startup circuit 120 increases the startup voltage VA.

In the above example, the clock signals CK and CKB do not simultaneously have a high level, the switch SW1 is turned on in a high level period of the clock signal CK, and the switch SW2 is turned on in a high level period of the clock signal CKB; however, the present application is not limited to the above examples. In other embodiments, the clock signals CK and CKB may be set not to simultaneously have a high level, the switch SW1 is turned on in a low level period of the clock signal CK, and the switch SW2 is turned on in a low level period of the clock signal CKB.

Figure 3:
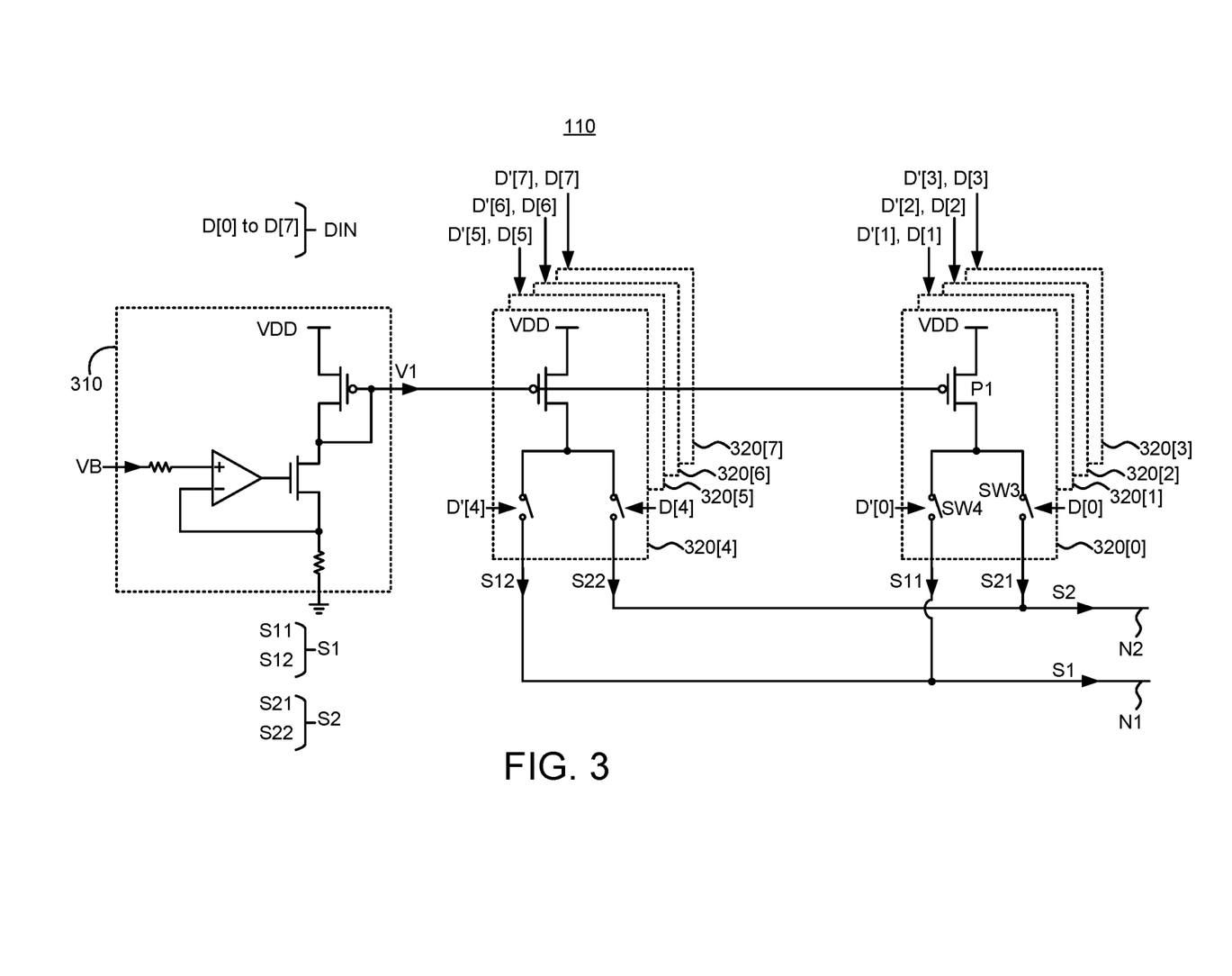
FIG. 3 is a circuit schematic diagram of a digital-to-analog converter (DAC) in FIG. 1 according to some embodiments of the present application.

FIG. 3 shows a circuit schematic diagram of the DAC 110 in FIG. 1 according to some embodiments of the present application. In this example, the DAC 110 includes a current regulating circuit 310 and a plurality of current source circuits 320[0] to 320[7]. The current regulating circuit 310 generates a voltage V1 according to a voltage VB. In some embodiments, the voltage VB may be, for example but not limited to, the reference voltage VREF or the startup voltage VA. In some embodiments, the current regulating circuit 310 may include a low dropout (LDO) regulator (for example, a resistor, an amplifier and an N transistor in the current regulating circuit 310) and a transistor connected in the form of a diode (for example, a P-type transistor in the current regulating circuit 310), wherein the transistor connected in the form of a diode and the plurality of current source circuits 320[0] to 320[7] may form a current mirror.

The current source circuits 320[0] to 320[3] generate a signal component S11 of the signal S1 and a signal component S21 of the signal S2 according to part of bits of the audio data DIN. Similarly, the current source circuits 320[4] to 320[7] generate another signal component S12 of the signal S1 and another signal component S22 of the signal according to the remaining bits of the audio data DIN, wherein the signal component S11 and the signal component S12 may be added at the node N1 to form the signal S1, and the signal component S21 and the signal component S22 may be added at the node N2 to form the signal S2.

For example, assuming that the audio data DIN has 8 bits D[0] to D[7], the plurality of current source circuits 320[0] to 320[3] may generate the signal component S11 and the signal component S21 according to a plurality of bits D'[0] to D'[3] and the bits D[0] to D[3] of the audio data DIN, and the plurality of current source circuits 320[4] to 320[7] may generate the signal component S12 and the signal component S22 according to a plurality of bits Dr[4] to D'[7] and the bits D[4] to D[7] of the audio data DIN. Each of the bits D'[0] to D'[7] has a logical value opposite to that of the corresponding one of the bits D[0] to D[7]. For example, when the logical value of the bit D[0] is 1, the logical value of the bit D'[0] is 0. Alternatively, when the logical value of the bit D[1] is 0, the logical value of the bit D'[1] is 1.

Each of the current source circuits 320[0] to 320[7] has a circuit structure identical to that of another, and may be configured to have the same current value, wherein the current source circuits 320[0] to 320[3] are connected in parallel to one another, and the current source circuits 320[4] to 320[7] are connected in parallel to one another. Taking the current source circuit 320[0] for example, the current source circuit 320[0] includes a transistor P1, a switch SW3 and a switch SW4. A first terminal of the transistor P1 receives the power supply voltage VDD, a second terminal of the transistor P1 is coupled to first terminals of the switch SW3 and the switch SW4, and a control terminal of the transistor P1 receives the voltage V1. The transistor P1 may generate a current (not shown) by means of biasing the voltage V1 for the switches SW3 and SW4. A second terminal of the switch SW3 is coupled to the node N2, and a control terminal SW3 receives the bit D[0]. A second terminal of the switch SW4 is coupled to the node N1, and a control terminal SW4 receives the bit D'[0]. The switch SW3 is turned on according to the bit D[0] to output a current generated by the transistor P1 as a part of the signal component S21. The switch SW4 is turned on according to the bit D'[0] to output a current generated by the transistor P1 as a part of the signal component S11. For example, if the bit D[0] has a logical value 0, the bit D'[0] has a logical value 1. Under the above conditions, the switch SW3 is turned on and the switch SW4 is turned off to output the part of the signal component S21. Alternatively, if the bit D[0] has a logical value 1, the bit D'[0] has a logical value Under the above conditions, the switch SW3 is turned off and the switch SW4 is turned on to output the part of the signal component S11.

Similarly, the current source circuit 320[1] may generate another part of the signal component S21 or another part of the signal component S11 according to the bit D[1] and the bit D'[1]. The current source circuit 320[4] may generate a part of the signal component S22 or a part of the signal component S12 according to the bit D[4] and the bit D'[4].

Similarly, it can be understood that the current source circuit 320[7] may generate another part of the signal component S22 or another part of the signal component S12 according to the bit D[7] and the bit D'[7].

Figure 4:
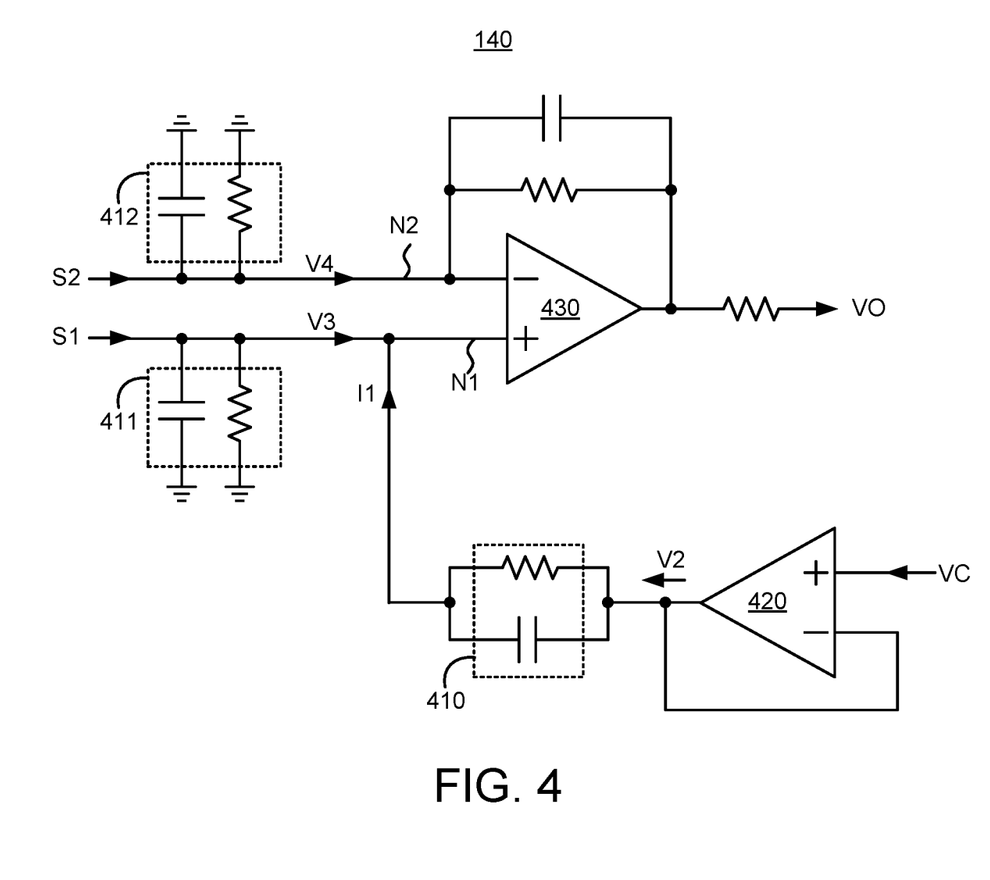
FIG. 4 is a circuit schematic diagram of an output amplifier in FIG. 1 according to some embodiments of the present application.

FIG. 4 shows a circuit schematic diagram of the output amplifier 140 in FIG. 1 according to some embodiments of the present application. The output amplifier 140 includes a plurality of impedance circuits 410 to 412, a buffer 420 and an amplifier 430. The buffer circuit 420 may generate the voltage V2 according to the control signal VC. For example, the buffer 420 may be implemented by an amplifier configured with a single gain. A positive input terminal of the buffer 420 is coupled to the multiplexer 130 in FIG. 1 to receive the control voltage VC. A negative input terminal of the buffer 420 is coupled to an output terminal of the buffer 420 to generate the voltage V2.

Each of the plurality of impedance circuits 410 to 412 includes a set of a resistor and a capacitor connected in parallel. The impedance circuit 410 is coupled between an output terminal of the buffer 420 and a positive input terminal (that is, the node N1) of the amplifier 430, to convert the voltage V2 into a current signal I1 and transmit the current signal I1 to the node N1. The impedance circuit 411 is coupled between the node N1 and ground, and converts a sum of the current signal I1 and the signal S1 into a voltage V3. The impedance circuit 412 is coupled between a negative input terminal (that is, the node N2) of the amplifier 430 and ground, and converts the signal S2 into a voltage V4. Thus, the amplifier 430 may generate the audio signal VO according to the voltage V3 and the voltage V4. For example, if the plurality of bits D[0] to D[7] in FIG. 3 all have a logical value 0, the switch SW3 of each of the current source circuits 320[0] to 320[7] is turned on and the switch SW4 is turned off, such that the signal S1 is 0 and the signal S2 is a maximum value. Thus, the output signal VO may have a lowest level. Alternatively, if the plurality of bits D[0] to D[7] in FIG. 3 all have a logical value 1, the switch SW3 of each of the current source circuits 320[0] to 320[7] is turned off and the switch SW4 is turned on, such that the signal S1 is a maximum value and the signal S2 is Thus, the output signal VO may have a highest level. In some embodiments, the amplifier 430 may include other resistors or capacitors to perform voltage regulation and/or filtering, or use resistors to convert a generated voltage into a current signal.

It is known from FIG. 4 that, the control voltage VC affects a common mode level of the positive input terminal of the amplifier 430. If the control voltage VC instantaneously rises during a startup, the amplifier 430 is caused to generate the audio signal VO having a higher level, hence forming an unnecessary noise. Hence, by configuring the startup circuit 120, the startup voltage VA can gradually rise during the startup so as to gradually adjust the common mode level at the positive input terminal of the amplifier 430, thereby improving the issues above.

Figure 5:
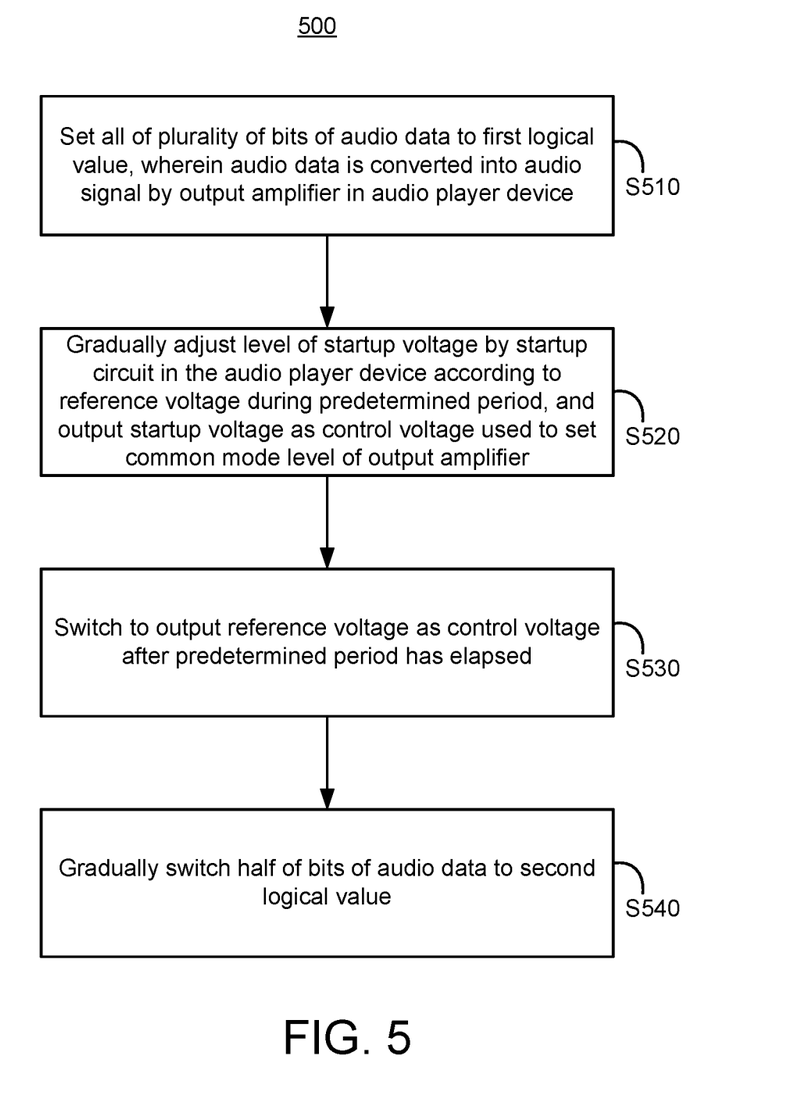
FIG. 5 is a flowchart of a startup method according to some embodiments of the present application.

FIG. 5 shows a flowchart of a startup method 500 according to some embodiments of the present application. In some embodiments, the startup method 500 may be used to start the audio player device 100 in FIG. 1. In some embodiments, the startup method 500 may be performed by software or a controller in the system of the audio player device 100.

In operation S510, a plurality of bits of audio data are all set to a first logical value, wherein the audio data is converted into an audio signal by an output amplifier (for example, the output amplifier 140) in the audio player device. For example, after power is supplied to the audio player device 100, the multiplexer 130 is set by software or a controller in the system to output the startup voltage VA as the control voltage VC. Next, the software or controller in the system may further set all of the plurality of bits D[0] to D[7] of the audio data DIN to a logical value 0 corresponding to a low level. As described previously, under the above conditions, the signal S1 is 0 and the signal S2 is a maximum value, such that the audio signal VO may have a lowest level. Thus, a noise generated by the audio player device 100 can be inhibited.

In operation S520, a level of a startup voltage (for example, the startup voltage VA) is gradually adjusted by a startup circuit (for example, the startup circuit 120) in the audio player device according to a reference voltage (for example, the reference voltage VREF) during a predetermined period, and the startup voltage is output as a control voltage (for example, the control voltage VC), wherein the control voltage is used to set a common mode level (for example, a common mode level of the positive input terminal of the amplifier 430) of an output amplifier. In operation S530, it is switched to output the reference voltage as the control voltage after the predetermined period has elapsed. Details of operation S520 and operation S530 may be referred from the description associated with the above embodiments, and are omitted herein. With the operation S520 and operation S530, a noticeable voltage jump is prevented from occurring at the positive input terminal of the output amplifier 140, thereby preventing a noticeable noise from being generated during a startup. In some embodiments, after completing the operation S530, the startup circuit 120 is turned off to reduce the overall power consumption.

In operation S540, a half of the bits are gradually switched to a second logical value. For example, software or a controller in the system may gradually switch a half (for example, the bits D[0] to D[3]) of the plurality of bits D[0] to D[7] of the audio signal DIN from a logical value 0 corresponding to a low level to a logical value 1 corresponding to a high level. Thus, the signal S1 may be the same as the signal S2, thereby adjusting the common mode level of the output amplifier 140 to a predetermined value. Under the above conditions, it means that the startup procedure of the audio player device 100 has ended. In some embodiments, software of a controller in the system may time by using a digital circuit (for example, a counter), and switch one bit from a logical value 0 to a logical value 1 at a time interval.

The plurality operations of the startup method 500 above are merely examples, and are not limited to being performed in the order specified in these examples. Without departing from the operation means and ranges of the various embodiments of the present application, additions, replacements, substitutions or omissions may be made to the operations of the startup method 500, or the operations may be performed in different orders.

In some embodiments, the operations of the startup method 500 may be referred to reduce the noise generated during a shutdown of the audio player device 100. For example, the plurality of operations in FIG. 5 may be performed in a reverse order to inhibit a noise generated during a shutdown of the audio player device 100.

In conclusion, the audio player device and the startup method thereof of some embodiments of the present application are capable of gradually adjusting a level of an internal voltage during a startup, so as to prevent a noise from being generated during the startup when audio is played.

While the present application has been described by way of example and in terms of the preferred embodiments, it is to be understood that the disclosure is not limited thereto. Various modifications made be made to the technical features of the disclosure by a person skilled in the art on the basis of the explicit or implicit disclosures of the present application. The scope of the appended claims of the present application therefore should be accorded with the broadest interpretation so as to encompass all such modifications.

What is claimed is:

1. An audio player device, comprising:
    a digital-to-analog converter (DAC), converting audio data into a first signal and a second signal;
    a startup circuit, gradually increasing a level of a startup voltage according to a reference voltage during a predetermined period;
    a multiplexer, outputting the startup voltage as a control voltage during the predetermined period, and switching to output the reference voltage as the control voltage after the predetermined period has elapsed; and
    an output amplifier, generating an audio signal according to the control voltage, the first signal and the second signal, wherein the control voltage is used to set a common mode voltage of the output amplifier.

2. The audio player device according to claim 1, wherein the startup circuit performs a capacitor charge/discharge operation according to a plurality of clock signals and the reference voltage to generate the startup voltage, and the clock signals are non-overlapping clock signals.

3. The audio player device according to claim 2, wherein a speed at which the startup circuit increases the level of the startup voltage gets slower as frequencies of the clock signals are lower.

4. The audio player device according to claim 2, wherein the startup circuit charges a first capacitor by the reference voltage, and transfers charge from the first capacitor to a second capacitor to generate the startup voltage, and a speed at which the startup circuit increases the level of the startup voltage gets slower as a capacitance ratio between the second capacitor and the first capacitor gets higher.

5. The audio player device according to claim 1, wherein the startup circuit comprises:
    a first capacitor;
    a first switch, turned on according to a first clock signal to transmit the reference voltage to the first capacitor so as to charge the first capacitor;
    a second capacitor; and
    a second switch, turned on according to a second clock signal to transfer charge from the first capacitor to the second capacitor so as to generate the startup voltage;
    wherein, when one of the first switch and the second switch is turned on, the other of the first switch and the second switch is turned off.

6. The audio player device according to claim 5, wherein the startup circuit further comprises:
    an adjustable clock generator, generating a system clock signal; and
    a non-overlapping clock generator, generating the first clock signal and the second clock signal according to the system clock signal.

7. The audio player device according to claim 1, wherein after the predetermined period has elapsed, the level of the startup voltage approximates or is equal to a level of the reference voltage.

8. The audio player device according to claim 1, wherein the output amplifier comprises:
    a buffer, generating a first voltage according to the control voltage;
    a first impedance circuit, converting the first voltage into a current signal;
    an amplifier;
    a second impedance circuit, coupled to a first input terminal of the amplifier to receive the first signal and the current signal and convert a sum of the first signal and the current signal into a second voltage; and
    a third impedance circuit, coupled to a second input terminal of the amplifier to receive the second signal and convert the second signal into a third voltage;
    wherein, the output amplifier generates the audio signal according to the second voltage and the third voltage.

9. The audio player device according to claim 1, wherein the DAC comprises:
    a plurality of first current source circuits, generating a signal component of the first signal and a signal component of the second signal according to part of bits of the audio data; and
    a plurality of second current source circuits, generating another signal component of the first signal and another signal component of the second signal according to remaining bits of the audio data.

10. A startup method, for starting an audio player device, the startup method comprising:
    setting all of a plurality of bits of audio data to a first logical value by software or a controller in the audio player device, wherein the audio data is converted into an audio signal by an output amplifier in the audio player device;
    gradually adjusting a level of a startup voltage by a startup circuit in the audio player device according to a reference voltage during a predetermined period, and outputting the startup voltage as a control voltage, wherein the control voltage is used to set a common mode level of the output amplifier;
    switching to output the reference voltage as the control voltage after the predetermined period has elapsed; and
    gradually switching a half of the bits to a second logical value.

* * * * *